United States Patent
Bjorksten et al.

[11] Patent Number: 5,930,148
[45] Date of Patent: Jul. 27, 1999

[54] METHOD AND SYSTEM FOR VERIFYING A DIGITAL CIRCUIT DESIGN INCLUDING DYNAMIC CIRCUIT CELLS THAT UTILIZE DIVERSE CIRCUIT TECHNIQUES

[75] Inventors: Andrew A. Bjorksten; Brian A. Zoric; Martin S. Schmookler, all of Austin, Tex.

[73] Assignee: International Business Machines Corporation, Armonk, N.Y.

[21] Appl. No.: 08/767,407

[22] Filed: Dec. 16, 1996

[51] Int. Cl.⁶ ..................................... G06F 17/50
[52] U.S. Cl. .......................... 364/488; 364/489; 364/490; 364/491; 364/578
[58] Field of Search .................... 364/488, 489, 364/490, 491, 578; 395/500

[56] References Cited

U.S. PATENT DOCUMENTS

| | | |
|---|---|---|
| 4,907,180 | 3/1990 | Smith . |
| 5,095,454 | 3/1992 | Huang . |
| 5,222,030 | 6/1993 | Dangelo et al. . |
| 5,272,434 | 12/1993 | Meyrueix et al. . |
| 5,452,239 | 9/1995 | Dai et al. . |
| 5,461,576 | 10/1995 | Tsau et al. . |
| 5,493,508 | 2/1996 | Dangelo et al. ..................... 364/489 |
| 5,526,277 | 6/1996 | Dangelo et al. . |
| 5,555,201 | 9/1996 | Dangelo et al. ..................... 364/489 |
| 5,623,418 | 4/1997 | Rostoker et al. ..................... 364/489 |

*Primary Examiner*—Kevin J. Teska
*Assistant Examiner*—Thuan Do
*Attorney, Agent, or Firm*—Anthony V.S. England; Brian F. Russell; Andrew J. Dillon

[57] ABSTRACT

A method and system are described, which utilize timing analysis to verify a digital circuit design that includes a plurality of dynamic logic circuit cells employing diverse circuit techniques and that may also include static logic circuit cells. For each dynamic circuit cell, a set of timing constraints is defined based upon the circuit technique employed by the associated dynamic logic circuit cell. Each timing constraint prevents a possible mode of failure of the associated dynamic logic circuit cell. The digital circuit design is then verified. The verification includes a determination of whether or not each dynamic logic circuit cell satisfies its respective set of timing constraints while connected to the other circuit cells. In an embodiment in which the digital circuit design includes a static logic circuit cell, the verification includes a verification that the static logic circuit cell has a correct inversion relationship between its input and output.

23 Claims, 7 Drawing Sheets

Delayed Reset Domino

Non-inverting Preset

METHOD AND SYSTEM FOR VERIFYING A DIGITAL CIRCUIT DESIGN INCLUDING DYNAMIC CIRCUIT CELLS THAT UTILIZE DIVERSE CIRCUIT TECHNIQUES

BACKGROUND OF THE INVENTION

1. Technical Field

The present invention relates in general to the verification of a digital circuit design and in particular to a method and system for verifying a digital circuit design utilizing timing analysis. Still more particularly, the present invention relates to a method and system for utilizing timing analysis to verify a digital circuit design including dynamic circuit cells that employ diverse circuit techniques.

2. Description of the Related Art

In a typical automated design process, such as that supported by a conventional electronic computer-aided design (ECAD) system, a designer enters a high-level design description utilizing either a hardware description language such as VHDL or interactively through the use of a schematic editor that produces a representation of the various circuit blocks and their interconnections. The ECAD system synthesizes a gate-level circuit design from the design description utilizing either predesigned circuit cells within a cell library or random logic macros (RLMs) generated directly from the design description. The gate-level circuit design is then typically verified to ensure that both functional and timing requirements of the circuit design are satisfied prior to developing a circuit layout (floorplan).

Conventional ECAD systems usually verify circuit designs comprised of static logic utilizing a rudimentary form of timing analysis that simply determines if the time required for a change in the state of an input to change the state of an output is less than the interval specified by the circuit designer. Although this method of circuit design verification is adequate for circuits implemented utilizing static logic, conventional timing analysis cannot adequately verify the operability of circuit designs comprising circuit cells that employ diverse circuit techniques, for example, both static and dynamic logic or multiple types of dynamic logic. Consequently, alternative methods of circuit verification, such as topological verification, must be utilized.

In topological verification, a set of rules is defined that specifies all permissible types of connections between circuit cells. Verification is accomplished by performing the relatively straightforward task of determining whether or not each circuit cell interconnection within the circuit design comports with the defined topological rules. In ECAD systems that utilize topological verification, only circuit designs in which all circuit cell connections satisfy the topological rules for all operating scenarios are verified as operable circuit designs. Thus, circuit designs including connections that are verifiable only if additional timing and signalling constraints are met are not successfully verified utilizing conventional topological verification. Thus, although topological verification has proved to be suitable for verifying conservative circuit designs, topological verification is less useful for high performance dynamic logic circuit designs since the strict topological rules impose unnecessary restrictions upon the types of connections that can be made within a circuit, thereby ruling out a number of useful connections that may be utilized to improve a circuit's performance characteristics. This is particularly true with reference to circuit designs including dynamic logical cells employing diverse circuit techniques and therefore having diverse functional and signalling constraints.

As should thus be apparent, it would be desirable to provide an improved method and system for verifying a digital circuit design, which support the verification of circuit designs including dynamic logic cells that employ diverse circuit techniques.

SUMMARY OF THE INVENTION

It is therefore one object of the present invention to provide an improved method and system for verifying a digital circuit design.

It is another object of the present invention to provide an improved method and system for verifying a digital circuit design utilizing timing analysis.

It is yet another object of the present invention to provide an improved method and system for utilizing timing analysis to verify a digital circuit design including cells that employ diverse circuit techniques.

The foregoing objects are achieved as is now described. A method and system are provided, which utilize timing analysis to verify a digital circuit design including dynamic circuit cells that employ diverse circuit techniques. According to the present invention, a digital circuit design including a plurality of circuit cells is provided. The plurality of circuit cells include a first circuit cell comprising dynamic logic and a second circuit cell, which utilize diverse circuit techniques. The input of the first circuit cell is connected to the output of the second circuit cell. A first set of timing constraints is defined for the first circuit cell. Each timing constraint within the first set of timing constraints prevents a possible mode of failure of the first circuit cell. The digital circuit design is then verified. The verification includes a determination of whether or not the first circuit cell satisfies the first set of timing constraints while connected to the second circuit cell. In an embodiment in which the digital circuit design includes a static logic circuit cell, the verification includes a verification that the static logic circuit cell has a correct inversion relationship between its input and output.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
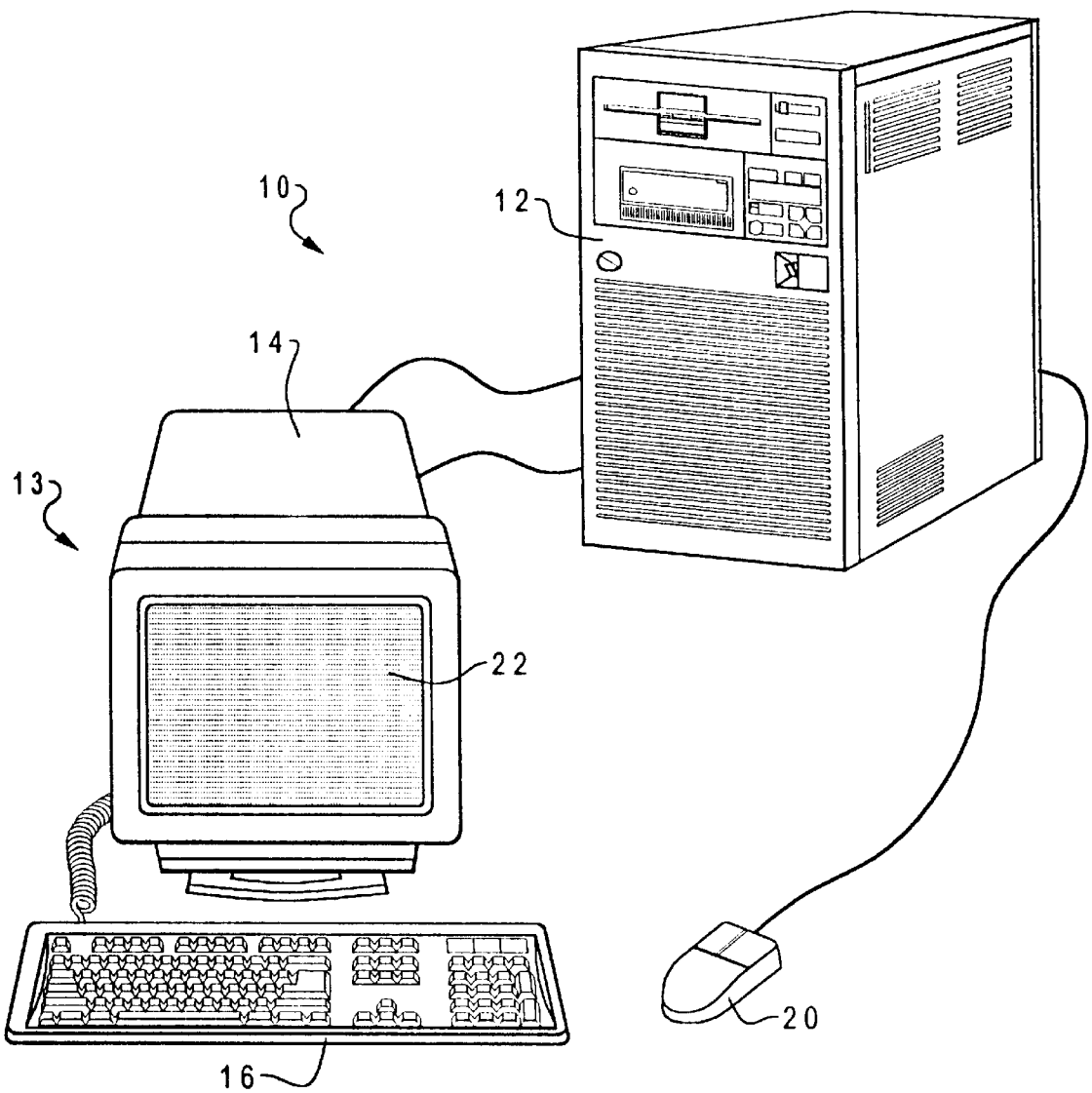
FIG. 1 depicts an illustrative embodiment of a data processing system with which the present invention may advantageously be utilized.

With reference now to the figures and in particular with reference to FIG. 1, there is depicted an illustrative embodiment of a data processing system with which the present invention may advantageously be utilized. As illustrated, data processing system 10 comprises a workstation 12 to which one or more nodes 13 are connected. Workstation 12 preferably comprises a high performance multiprocessor computer, such as the RISC System/6000 or AS/400 computers available from International Business Machines Corporation. Workstation 12 preferably includes nonvolatile and volatile internal storage for storing software applications comprising an ECAD system, which can be utilized to develop and verify an integrated circuit design in accordance with the method of the present invention. As depicted, each node 13 comprises a display device 14, keyboard 16, and mouse 20. The ECAD software applications executing within workstation 12 preferably display a graphical user interface (GUI) within display screen 22 of display device 14 with which a digital circuit designer can interact utilizing keyboard 16 and mouse 20. Thus, by entering appropriate inputs utilizing keyboard 16 and mouse 20, the digital circuit designer is able to develop and verify a digital circuit design according to the method described further hereinbelow.

Figure 2:
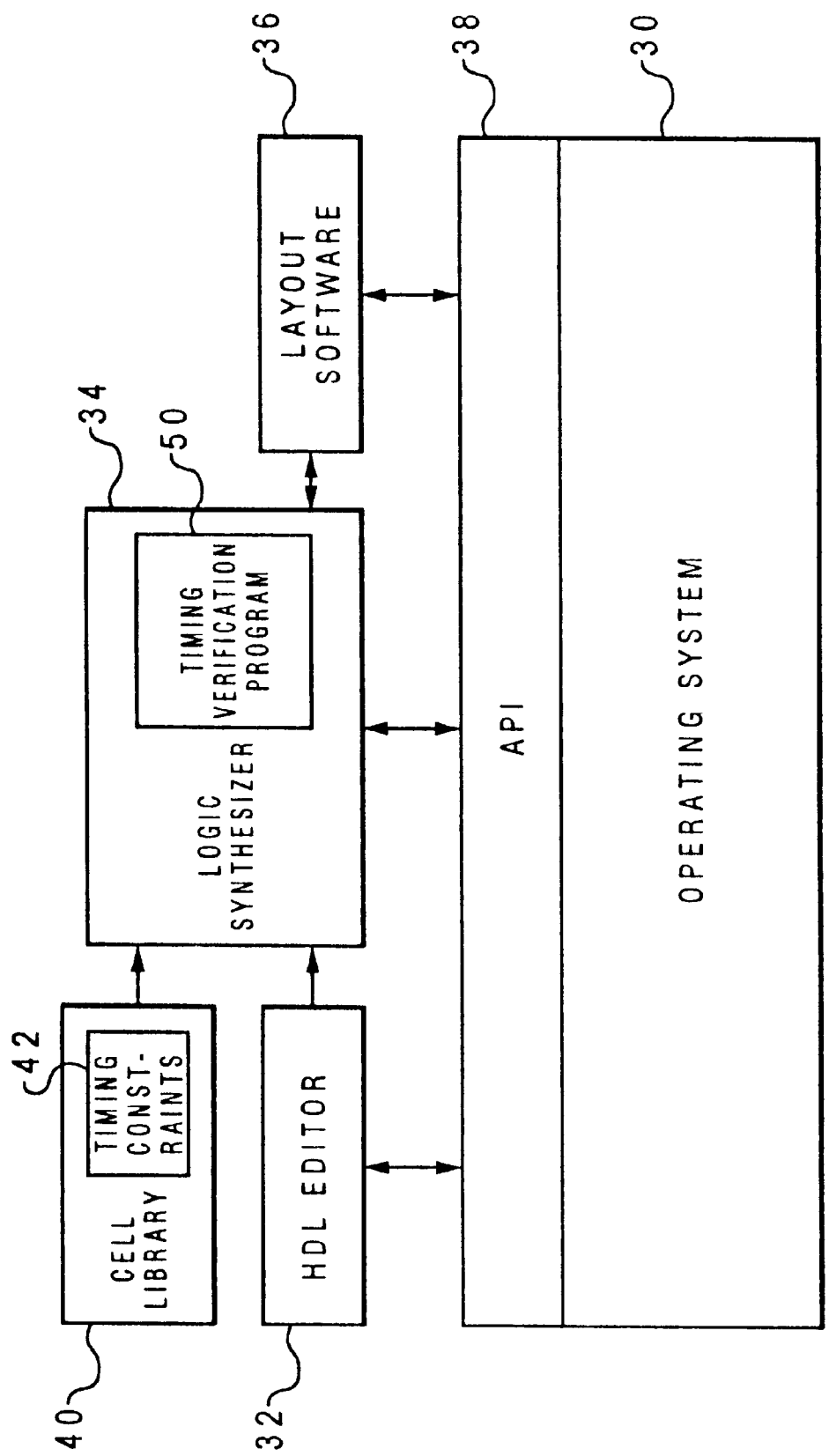
FIG. 2 illustrates a block diagram depiction of the software configuration of the data processing system illustrated in FIG. 1.

Referring now to FIG. 2, there is illustrated a block diagram depiction of an illustrative embodiment of the software configuration of data processing system 10. As illustrated, the software configuration of data processing system 10 includes an operating system 30, which provides a background computing environment and controls the allocation of the resources of data processing system 10 to the ECAD system comprising HDL editor 32, logic synthesizer 34, and layout software 36. In addition, operating system 30 provides a number of system services which are accessible to software applications 32, 34, and 36 via an Application Programming Interface (API) 38.

HDL editor 32 provides facilities (e.g., a schematic editor) that permit a digital circuit designer to compose a high level hardware description language (HDL) logical definition of a digital circuit design. In addition to the inputs, logical functions, and outputs to be included within the digital circuit, the high level logical description developed utilizing HDL editor 32 also preferably includes timing requirements for the digital circuit design.

Logic synthesizer 34 is a software application that is utilized by a digital circuit designer to automatically synthesize a gate-level circuit design from a high level logical description. Logic synthesizer 34 preferably includes facilities for generating static and dynamic random logic macros (RLMs) from equations, net lists, or other logical description input formats. Logic synthesizer further includes facilities which, in response to receipt of a high level logical description of a standard functional block (e.g., a 2:1 multiplexer), accesses a circuit cell within cell library 40 that implements the standard functional block. In accordance with an important aspect of the present invention, cell library 40 preferably includes circuit cells that utilize diverse circuit techniques, including without limitation static logic, domino logic, delayed reset domino logic, pseudo-clocked logic, and non-inverting preset logic. As utilized hereinafter, the term "circuit technique" refers to a transistor topology having a particular signalling protocol, and if dynamic, a set of associated inter-signal timing constraints. Thus, the phrase "diverse circuit techniques" refers to transistor topologies that, while possibly compatible, require differing signalling protocols and/or timing constraints in order to operate correctly. In accordance with another important aspect of the present invention, cell library 40 stores the timing constraints 42 associated with each of the circuit cells that may be accessed or generated by logical synthesizer 34. In addition to the inter-signal timing constraints noted above, both static and dynamic circuit cells typically have an associated delay timing constraint that specifies the maximum permissible delay between the application of inputs to the circuit cell and the generation of an output. Timing constraints 42 are utilized by timing verification program 50 to verify a digital circuit design in accordance with the method hereinafter described.

Still referring to FIG. 2, the, software configuration of data processing system 10 further includes layout software 36, which is utilized by a digital circuit designer to develop a physical arrangement of gates and interconnect within an integrated circuit floorplan based upon a set of designer-supplied power and timing constraints.

Referring now to FIGS. 4A, 5A, 6A, and 7, there are depicted four exemplary circuit cells, which each implement the same logical function ([A0*A1]+[B0*B1]) utilizing diverse circuit techniques. In accordance with the present invention, a digital circuit design including two or more of these circuit techniques (or other circuit techniques) can be verified by defining a set of timing constraints for each circuit cell based upon the circuit technique employed by the circuit cell and verifying that signals input into and output from each circuit cell meet the circuit cell's associated set of timing constraints. The set of timing constraints associated with a circuit cell are derived by first analyzing the possible modes of failure of the circuit technique utilized to implemented the circuit cell. After the possible modes of failure of the circuit technique have been identified, a set of timing constraints are developed, which if satisfied, prevent the occurrence of each identified mode of failure. Of course, circuit cells that are not susceptible to failure due to signal timing (i.e., static circuit cells) have an empty set of inter-signal timing constraints (but may still have a delay timing constraint). If each circuit cell within a digital circuit design satisfies its associated set of timing constraints, then the aggregate design is verified as reliable, even if particular connections within the digital circuit design would fail topological verification.

Figure 4A:
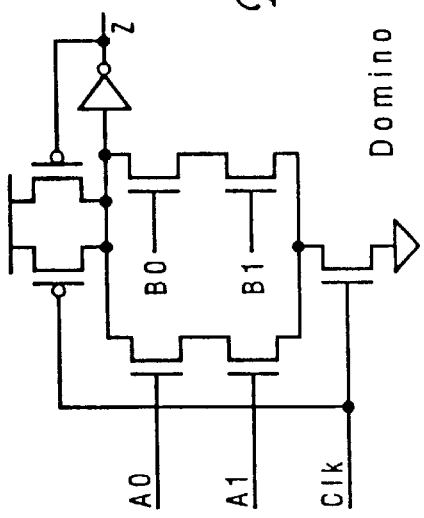
FIGS. 4A and 4B depict a domino circuit cell and a timing diagram illustrating a set of timing constraints utilized to verify operability of the domino circuit cell.
Figure 4B:
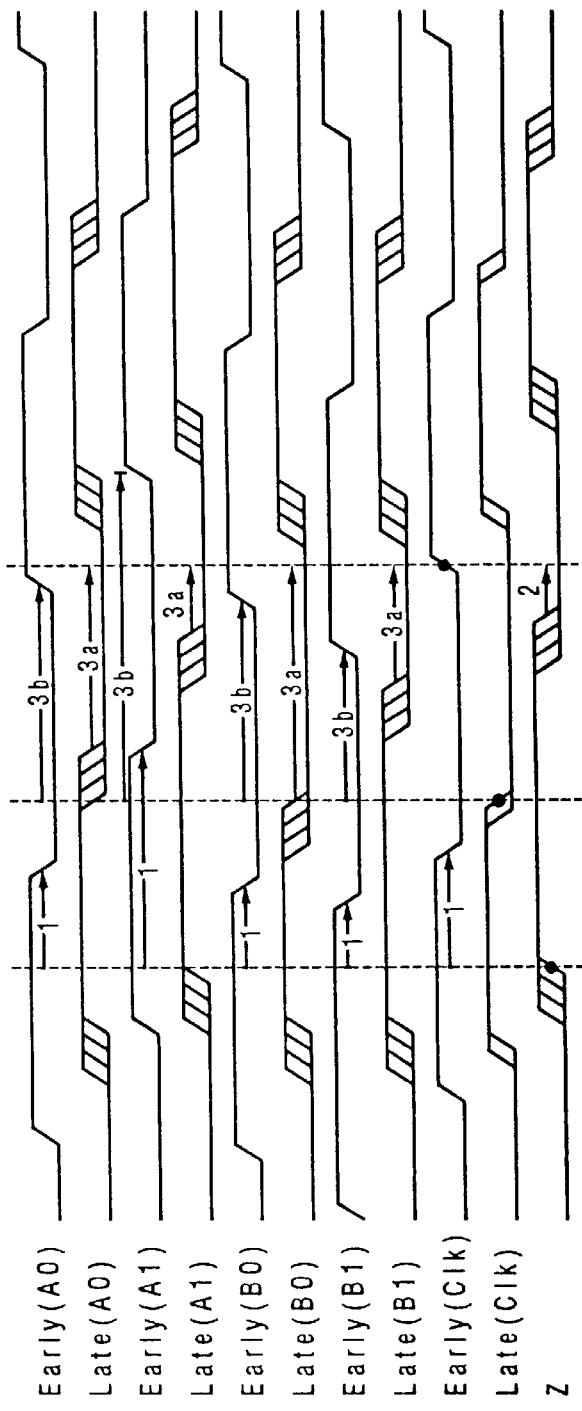

Referring in particular to FIGS. 4A and 4B, there are depicted a domino circuit cell and a timing diagram illustrating a set of timing constraints utilized to verify operability of the domino circuit cell. The timing constraints for domino circuits cells, which are indicated in FIG. 4B by corresponding numerals, can be grouped as follows:

(1) All of the input fall times must hold past the output rise time.

In order to achieve greater performance, this timing constraint can be relaxed by requiring only that the inputs in a given conduction path must hold past the output rise time caused by that conduction path. This timing constraint can be implemented in a timing analyzer by utilizing the output pin as a reference state and by verifying that inputs causing an output transition hold past the output rise time.

(2) The output fall time meets a setup to the clock rise time.

This timing constraint ensures that a domino circuit cell is reset properly. If this timing constraint is not satisfied, the domino circuit cell may not output a logical zero when logically required.

(3a) The fall time of each input meets a setup to the clock rise time.

This timing constraint ensures that old inputs are reset prior to reuse of the domino circuit cell.

(3b) The rise of each input does not occur until after the latest fall of the clock.

This timing constraint ensures that new inputs do not arrive prior to the reset phase of a domino circuit cell. If a timing constraint within either of groups (3a) and (3b) is not satisfied, the domino circuit cell may incorrectly evaluate based on the previous or next cycle's inputs.

Figure 5A:
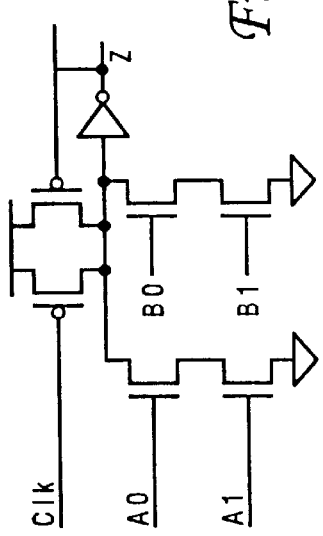
FIGS. 5A and 5B illustrate a delayed reset domino circuit cell and a timing diagram depicting a set of timing constraints utilized to verify operability of the delayed reset domino circuit cell.
Figure 5B:
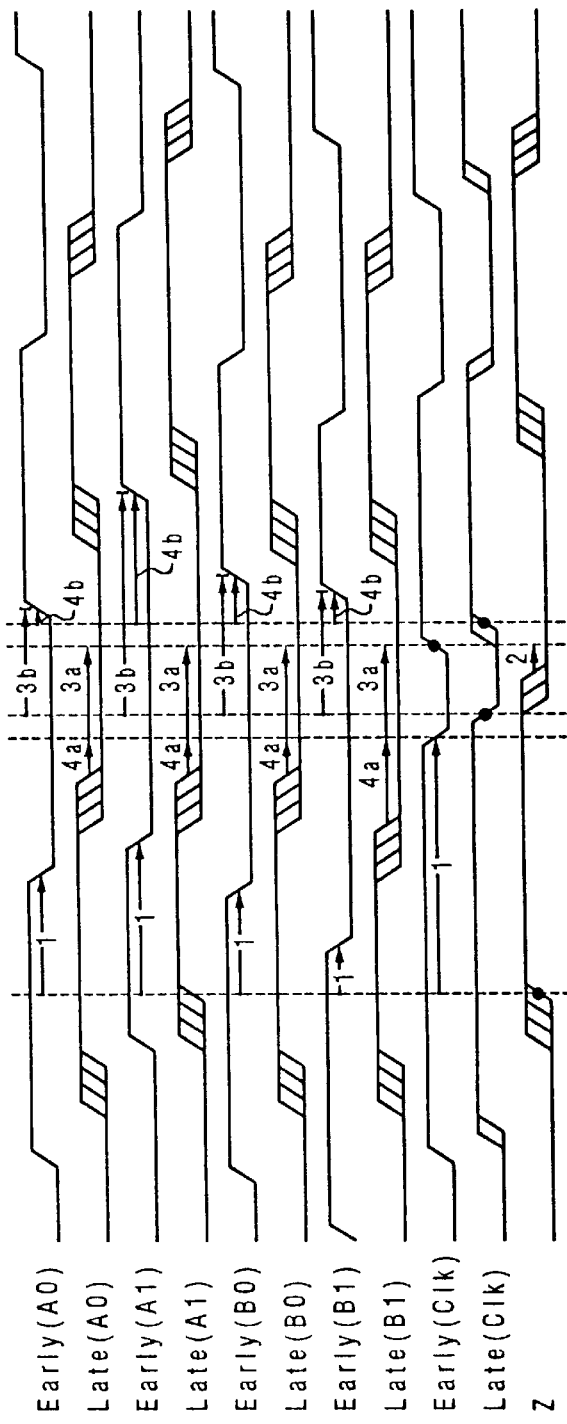

With reference now to FIGS. 5A and 5B, there are illustrated a delayed reset domino circuit cell and timing diagram depicting a set of timing constraints utilized to verify operability of the delayed reset domino circuit cell. The timing constraints for a delayed reset domino circuit cell can be grouped as follows:

(1) All of the input fall times must hold past the output rise time.

As noted above, this timing constraint can be relaxed by requiring only that the inputs in a (given conduction path must hold past the output rise time caused by that conduction path.

(2) The output fall time meets a setup to the clock rise time.

(3a) The fall time of each input meets a setup to the clock rise time.

(3b) The rise of each input does not occur until after the latest fall of the clock.

(4a) All of the input fall times must be setup before the clock fall time.

(4b) All of the input rise times must hold past the clock rise time.

Timing constraint groups (4a) and (4b) together ensure that DC current is not permitted to flow between the power and ground rails of the delayed reset domino circuit cell.

Figure 6A:
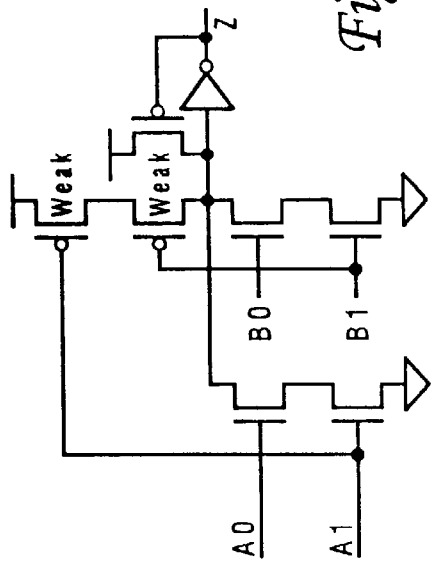
FIGS. 6A and 6B depict a pseudo-clocked circuit cell and a timing diagram illustrating a set of timing constraints utilized the verify the operability of the pseudo-clocked circuit cell.
Figure 6B:
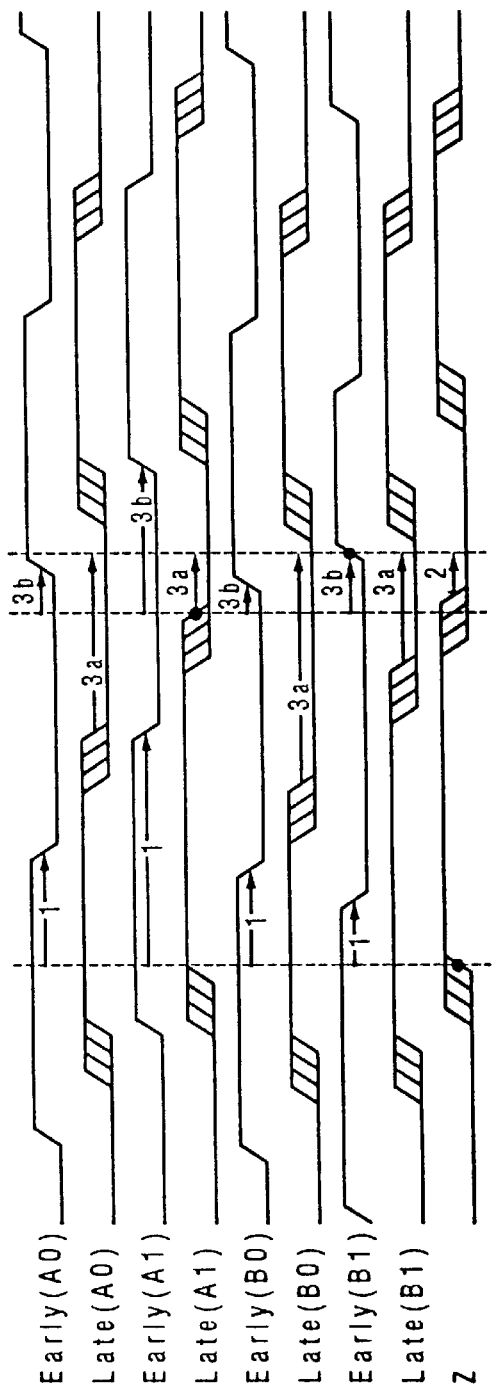

Referring to FIGS. 6A and 6B, there is depicted a pseudo-clocked circuit cell and timing diagram graphically indicating a set of timing constraints utilized to verify the operability of the pseudo-clocked circuit cell. The timing constraints for a pseudo-clock circuit cell can be grouped as follows:

(1) All input fall times (or at least those in conduction paths) must hold past the output rise time.

(2) The output fall time meets a setup to each of the dominant inputs rise times.

A dominant input is one that controls connections to both the ground and power rails of a circuit cell, and thus is utilized to pull up the internal node of the circuit cell. Inputs A1 and B1 are the dominant inputs of the pseudo-clocked circuit cell depicted in FIG. 6A. Verifying that the output fall time meets a setup to each of the dominant inputs' rise times ensures that a pseudo-clocked circuit cell is reset before it is utilized again. A failure to satisfy a timing constraint within this group may cause the pseudo-clocked circuit cell to not output a logical zero when logically required.

(3a) The fall time of each input meets a setup to the earliest dominant input's rise time.

(3b) The rise of each input does not occur until after the fall of the latest dominant input.

Timing constraint groups (3a) and (3b) together ensure that old inputs are reset before a pseudo-clocked circuit cell is again utilized and ensures that new inputs do not arrive before the pseudo-clocked circuit cell is properly reset. A failure to satisfy one of these timing constraints may cause a pseudo-clocked circuit cell to incorrectly evaluate based upon the previous or next cycle's inputs.

Figure 7:
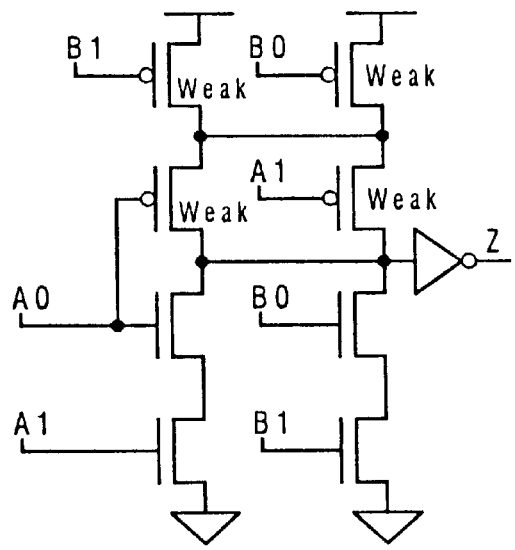
FIG. 7 illustrates a non-inverting preset circuit cell.

With reference now to FIG. 7, a non-inverting preset circuit cell is illustrated. Because non-inverting preset circuits don't have functional failures (i.e., the output will always settle to the correct logical value), no inter-signal timing constraints are required to ensure that non-inverting preset circuit cells function correctly. However, utilizing a non-inverting preset circuit incorrectly to evaluate zeros may cause performance degradation, which can be detected utilizing conventional cycle time analysis.

Figure 3:
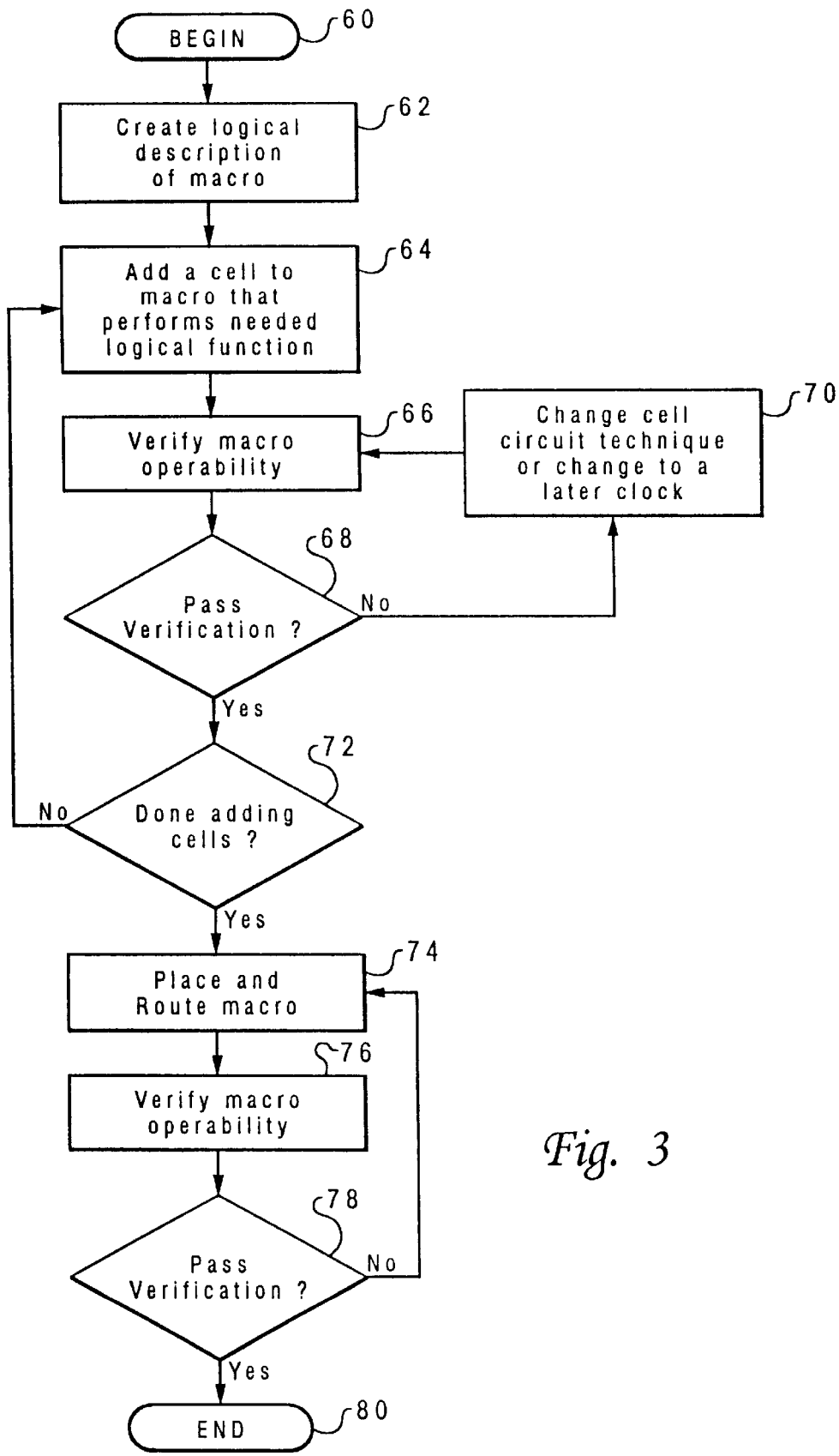
FIG. 3 is a high level logical flowchart of an automated process for designing a digital circuit that includes dynamic logic circuit cells employing diverse circuit techniques.

Referring now to FIG. 3, there is illustrated a high level logical flowchart of a process by which a digital circuit designer can develop and verify a digital circuit design utilizing the ECAD software system depicted in FIG. 2. As illustrated, the process begins at block 60 and thereafter proceeds to block 62, which depicts an integrated circuit designer creating a logical description of a macro (i.e., an integrated circuit design) utilizing HDL editor 32. As noted above, the logical description of the macro can include equations, net lists, or other description formats that specify random logic as well as invocations of circuit cells stored within cell library 40. Following the creation of the logical description of the macro, HDL editor 32 creates a logical description file, which 11 is then processed by logic synthesizer 34. The process proceeds from block 62 to block 64, which illustrates logic synthesizer 34 processing one or more statements within the logical description file that specify a logical function. Based upon the specified logical function, logic synthesizer 34 synthesizes a circuit cell that is added to the macro. Thus, block 64 illustrates logic synthesizer 34 either selecting a predefined circuit cell from within cell library 40 or synthesizing a random logic macro (RLM) to implement the specified logical function.

The process then proceeds from block 64 to block 66, which depicts timing verification program 50 verifying the circuit cell added to the macro at block 64. As described above, timing verification program 50 verifies the circuit cell by determining whether or not the circuit cell satisfies an associated set of timing constraints, if any, while the circuit cell is connected in the digital circuit. If the circuit cell added to the macro at block 64 is a static circuit cell and therefore has no associated inter-signal timing constraints, timing verification program 50 simply ensures that the circuit cell meets the delay timing constraint and uses a signalling protocol that is compatible with subsequent dynamic circuit cells. For example, if the dynamic circuit cells utilize non-inverting logic, verification program 50 verifies that the static circuit cell is also non-inverting. Conversely, if the dynamic circuit cells are inverting, verification program 50 verifies that the static circuit cell is also inverting. Following the verification of the circuit cell at block 66, the process passes to block 68, which illustrates a determination of whether or not the circuit cell was successfully verified. If not, the process passes to block 70, which depicts logic synthesizer 34 modifying the circuit technique or clocking utilized for the unsuccessfully verified circuit cell.

Figure 8:
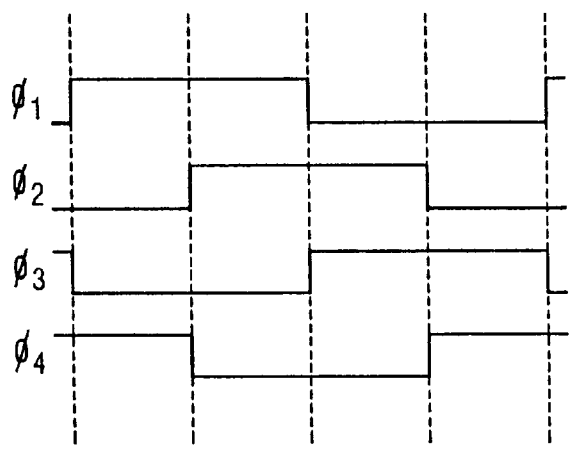
FIG. 8 depicts the timing relationship of the four clock phases utilized in a four-phase dynamic logic circuit.

In accordance with a preferred embodiment of the present invention, logic synthesizer 34 first attempts to address a failure to satisfy the timing constraints of the circuit cell by operating the circuit cell utilizing a later clock. For example, referring now to FIG. 8, there are depicted four clock signals that can be utilized to operate a poly-phase dynamic circuit cell. As illustrated, the clock phases, denoted $\Phi_1$–$\Phi_4$, have the same period, but are phase shifted with respect to each other. Thus, referring again to FIG. 3, in response to a determination at block 68 that the circuit cell failed to pass verification, logic synthesizer 34 first changes the clock phase utilized to operate the circuit cell to the next later clock phase. The process then returns to block 66, which depicts timing verification program 50 again verifying the operability of the macro. In response to a determination at block 68 that the macro has again failed to pass verification, the process returns to block 70. In the preferred embodiment, if the macro fails verification when operated utilizing each of the available clock phases, logic synthesizer 34 then implements the logical function of the circuit cell utilizing a different circuit technique, which is then verified by timing verification program 50 at block 66. For example, in response to unsuccessful verification of a delayed reset domino circuit cell when connected to each of the available clock phases, logic synthesizer 34 implements the logical function of the circuit cell utilizing domino logic rather than delayed reset domino logic.

Returning to block 68, in response to a determination that the circuit cell passes verification (i.e., the delay timing constraint and any intersignal timing constraints are satisfied), the process proceeds to block 72, which depicts a determination by logic synthesizer 34 whether the end of the logical description has been reached. If not, the process returns to block 64 which has been described. Although the illustrative method for developing a digital circuit design depicted in FIG. 3 verifies each circuit cell following its addition to the macro, alternative embodiments of the present invention can utilize heuristics to select circuit cell types that are likely to be verified and then verify the entire macro at once. Referring again to block 72, in response to a determination that each of the statements within the logical description has been parsed and synthesized, the process passes to block 74. Block 74 depicts layout software 36 developing a floorplan of an integrated circuit by placing the circuit cells synthesized by logic synthesizer 34 in a physical arrangement and routing the necessary interconnect. Following block 74, the process passes to block 76, which illustrates timing verification program 50 again verifying operability of the macro in order to ensure that any timing delays introduced by the wire routing and placement of the circuit cells do not cause any of the timing constraints of the circuit cells to be violated. In response to a determination at block 78 that the macro fails verification, the process returns to block 74, which illustrates layout software 36 again placing and routing the macro. Referring again to block 78, in response to a determination by timing verification program 50 that the macro passes verification, the process passes to block 80 and terminates. Thereafter, the macro developed and verified in accordance with the method depicted in FIG. 3 may be fabricated.

As has been described, the present invention provides an improved method and system for verifying a digital circuit design, which verify that each circuit cell within the digital circuit design satisfies a corresponding set of timing constraints. The present invention advantageously permits circuit designs including circuit cells that employ diverse circuit techniques to be verified utilizing timing analysis, thereby permitting the realization of digital circuit designs having aggressive performance requirements.

Although aspects of the present invention have been described with respect to specific "method steps" implementable on a computer systems, those skilled in the art will appreciate from the foregoing description that, in an alternate embodiment, the present invention may be implemented as a computer program product for use with a computer system. Those skilled in the art should readily appreciate that programs defining the functions of the present invention can be delivered to a computer via a variety of signal-bearing media, which include, but are not limited to: (a) information permanently stored on non-writable storage media (e.g., CD-ROM); (b) information alterably stored on writable storage media (floppy diskettes or hard disk drives); or (c) information conveyed to a computer through communication media, such as through a computer or telephone network. It should be understood, therefore, that such signal-bearing media, when carrying computer readable instructions that direct the method functions of the present invention, represent alternative embodiments of the present invention.

While the invention has been particularly shown and described with reference to a preferred embodiment, it will be understood by those skilled in the art that various changes in form and detail may be made therein without departing from the spirit and scope of the invention.

What is claimed is:

1. A method of verifying a digital circuit design, said method comprising:
   providing a digital circuit design including a plurality of circuit cells, said plurality of circuit cells including a first circuit cell and a second circuit cell that utilize diverse circuit techniques, said first circuit cell including dynamic logic, wherein an input of said first circuit cell is connected to an output of said second circuit cell;
   defining a first set of timing constraints for said first circuit cell, wherein each timing constraint within said first set of timing constraints prevents a possible mode of failure of said first circuit cell; and
   verifying said digital circuit design, wherein said verification includes a determination of whether or not said first circuit cell satisfies said first set of timing constraints while connected to said second circuit cell.

2. The method of claim 1, wherein, said step of providing a digital circuit design comprises:
   providing a library of compatible circuit cells;
   in response to receipt of a description of said digital circuit design, automatically synthesizing said plurality of circuit cells within said digital circuit design, wherein at least one circuit cell among said plurality of circuit cells within said digital circuit design is selected from within said library; and
   connecting each of said plurality of circuit cells to at least one other circuit cell among said plurality of circuit cells.

3. The method of claim 2, wherein each of said plurality of circuit cells is connected individually, and wherein said verifying step is performed after each of said plurality of circuit cells is connected.

4. The method of claim 1, wherein said first circuit cell performs a particular logical function, said method further comprising:
   in response to a determination that said first circuit cell fails to satisfy said first set of timing constraints, replacing said first circuit cell with a third circuit cell that performs said particular logical function utilizing a diverse circuit technique.

5. The method of claim 1, wherein:
   said digital circuit design has a plurality of clock signals, wherein first and second clock signals among said plurality of clock signals have identical periods and said second clock signal is delayed with respect to said first clock signal;

said verifying step comprises the step of determining if said first circuit cell satisfies said first set of timing constraints when clocked by said first clock signal; and said method further comprises the step of:

in response to a determination that said first circuit cell fails to satisfy said first set of timing constraints when clocked by said first clock signal, repeating said verifying step while clocking said first circuit cell with said second clock signal.

6. The method of claim 1, and further comprising the step of:

repeating said verifying step in response to placement of said plurality of circuit cells in a selected physical arrangement.

7. The method of claim 1, wherein said plurality of circuit cells includes a static circuit cell, wherein said verifying step further comprises the step of verifying that an output signal of said static circuit cell has a correct signal inversion relationship with an input signal of said static circuit cell.

8. A system for digital circuit design, said system comprising:

a processing unit;

a memory coupled to said processing unit;

a first set of timing constraints stored within said memory, wherein said first set of timing constraints is associated with a first dynamic circuit technique, wherein each timing constraint within said first set of timing constraints prevents a possible mode of failure of circuit cells of said first dynamic circuit technique; and a timing verification program stored within said memory and executable by said processing unit, wherein in response to receipt of a digital circuit design comprising a first circuit cell utilizing said first dynamic circuit technique and a second circuit cell utilizing a diverse circuit technique, said first circuit cell having an input connected to an output of said second circuit cell, said timing verification program verifies said digital circuit design, wherein said timing verification program includes means for determining whether said first circuit cell satisfies said first set of timing constraints while connected to said second circuit cell.

9. The system of claim 8, said system further comprising:

a logic synthesis program stored within said memory and executable by said processing unit, wherein in response to receipt of a functional description of said digital circuit design, said functional description indicating a plurality of logical functions, said logic synthesis program synthesizes a plurality of circuit cells that implement said plurality of logical functions and connects each of said plurality of circuit cells to at least one other circuit cell; and a library accessible by said logic synthesis program, wherein said library includes a plurality of predetermined circuit cells.

10. The system of claim 9, and further comprising:

means for creating said functional description of said digital circuit design.

11. The system of claim 9, wherein said logic synthesis program connects each of said plurality of circuit cells individually, and wherein said timing verification program verifies said digital circuit design after each of said plurality of circuit cells is connected.

12. The system of claim 9, wherein said first circuit cell performs a particular logical function, said logic synthesis program further comprising:

means, responsive to a determination by said timing verification program that said first circuit cell fails to satisfy said first set of timing constraints, for replacing said first circuit cell with a third circuit cell that performs said particular logical function utilizing a diverse dynamic circuit technique.

13. The system of claim 8, wherein:

said digital circuit design has a plurality of clock signals, wherein first and second clock signals among said plurality of clock signals have identical periods and said second clock signal is delayed with respect to said first clock signal; and said timing verification program further comprises:

means, responsive to a determination that said first circuit cell fails to satisfy said first set of timing constraints when clocked by said first clock signal, for repeating said verifying step while clocking said first circuit cell with said second clock signal.

14. The system of claim 8, wherein:

said system further comprises means for automatically placing said plurality of circuit cells comprising said digital circuit design in a physical arrangement; and said timing verification program includes means for verifying said digital circuit design in response to placement of said plurality of circuit cells in said physical arrangement.

15. The system of claim 8, wherein said digital circuit design includes a static circuit cell having an input for receiving an input signal and an output for outputting an output signal, wherein said timing verification program further comprises means for verifying that said output signal has a correct signal inversion relationship with said input signal.

16. A program product for use with a data processing system, said program product comprising:

a first set of timing constraints associated with a first dynamic circuit technique, wherein each timing constraint within said first set of timing constraints prevents a possible mode of failure of circuit cells of said first dynamic circuit technique; and a timing verification program executable a data processing system, wherein in response to receipt of a digital circuit design comprising a first circuit cell utilizing said first dynamic circuit technique and a second circuit cell utilizing a diverse circuit technique, said first circuit cell having an input connected to ii an output of said second circuit cell, said timing verification program verifies said digital circuit design, wherein said timing verification program includes means for determining whether said first circuit cell satisfies said first set of timing constraints while connected to said second circuit cell; and signal-bearing media bearing said first set of timing constraints and said timing verification program.

17. The program product of claim 16, said program product further comprising:

a logic synthesis program executable by said data processing system, wherein in response to receipt of a functional description of said digital circuit design, said functional description indicating a plurality of logical functions, said logic synthesis program synthesizes a plurality of circuit cells that implement said plurality of logical functions and connects each of said plurality of circuit cells to at least one other circuit cell; and a library accessible by said logic synthesis program, wherein said library includes a plurality of predetermined circuit cells.

18. The program product of claim 17, and further comprising:
means for creating said functional description of said digital circuit design.

19. The program product of claim 17, wherein said logic synthesis program connects each of said plurality of circuit cells individually, and wherein said timing verification program verifies said digital circuit design after each of said plurality of circuit cells is connected.

20. The program product of claim 17, wherein said first circuit cell performs a particular logical function, said logic synthesis program further comprising:
means, responsive to a determination by said timing verification program that said first circuit cell fails to satisfy said first set of timing constraints, for replacing said first circuit cell with a third circuit cell that performs said particular logical function utilizing a diverse dynamic circuit technique.

21. The program product of claim 16, wherein:
said digital circuit design has a plurality of clock signals, wherein first and second clock signals among said plurality of clock signals have identical periods and said second clock signal is delayed with respect to said first clock signal; and
said timing verification program further comprises:
means, responsive to a determination that said first circuit cell fails to satisfy said first set of timing constraints when clocked by said first clock signal, for repeating said verifying step while clocking said first circuit cell with said second clock signal.

22. The program product of claim 16, wherein:
said program product further comprises means for automatically placing said plurality of circuit cells comprising said digital circuit design in a physical arrangement; and
said timing verification program includes means for verifying said digital circuit design in response to placement of said plurality of circuit cells in said physical arrangement.

23. The program product of claim 16, wherein said digital circuit design includes a static circuit cell having an input for receiving an input signal and an output for outputting an output signal, wherein said timing verification program further comprises means for verifying that said output signal has a correct signal inversion relationship with said input signal.

* * * * *